United States Patent
Lee et al.

(10) Patent No.: US 8,630,370 B2
(45) Date of Patent: Jan. 14, 2014

(54) APPARATUS AND METHOD FOR COMPENSATING FOR IQ MISMATCH IN MOBILE COMMUNICATION SYSTEM

(75) Inventors: Young-Taek Lee, Seongnam-si (KR); Hoon-Tae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 211 days.

(21) Appl. No.: 13/122,300

(22) PCT Filed: Oct. 7, 2009
(Under 37 CFR 1.47)

(86) PCT No.: PCT/KR2009/005721
§ 371 (c)(1),
(2), (4) Date: Apr. 1, 2011

(87) PCT Pub. No.: WO2010/041866
PCT Pub. Date: Apr. 15, 2010

(65) Prior Publication Data
US 2012/0008705 A1    Jan. 12, 2012

(30) Foreign Application Priority Data

Oct. 7, 2008 (KR) .................. 10-2008-0098198
Oct. 6, 2009 (KR) .................. 10-2009-0094639

(51) Int. Cl.
*H03C 3/00* (2006.01)
(52) U.S. Cl.
USPC ........................................... 375/302
(58) Field of Classification Search
USPC .............. 375/302, 375, 324, 221, 285
See application file for complete search history.

(56) References Cited

U.S. PATENT DOCUMENTS

| | | | | |
|---|---|---|---|---|
| 4,559,569 A | * | 12/1985 | Otsuki et al. | 360/65 |
| 5,105,195 A | * | 4/1992 | Conrad | 342/174 |
| 8,259,888 B2 | * | 9/2012 | Hua et al. | 375/375 |
| 2002/0012405 A1 | * | 1/2002 | Lee et al. | 375/300 |
| 2004/0092241 A1 | | 5/2004 | Kim et al. | |
| 2005/0075815 A1 | | 4/2005 | Webster et al. | |
| 2005/0245225 A1 | | 11/2005 | Park et al. | |
| 2006/0176975 A1 | * | 8/2006 | Hsieh et al. | 375/285 |
| 2007/0002968 A1 | | 1/2007 | Pan | |
| 2008/0139119 A1 | * | 6/2008 | Behzad et al. | 455/41.2 |
| 2009/0023413 A1 | * | 1/2009 | Xu et al. | 455/319 |
| 2009/0175398 A1 | * | 7/2009 | Inanoglu et al. | 375/376 |
| 2010/0027689 A1 | * | 2/2010 | Kohlmann | 375/260 |
| 2011/0064166 A1 | * | 3/2011 | Khoshgard et al. | 375/324 |
| 2012/0263215 A1 | * | 10/2012 | Peng | 375/221 |

FOREIGN PATENT DOCUMENTS

| | | |
|---|---|---|
| EP | 1 164 759 A2 | 12/2001 |
| JP | 55-23699 A | 2/1980 |
| WO | 2007/146090 A2 | 12/2007 |

* cited by examiner

*Primary Examiner* — Jaison Joseph
(74) *Attorney, Agent, or Firm* — Jefferson IP Law, LLP

(57) ABSTRACT

An apparatus and a method for increasing Error Vector Magnitude (EVM) performance representing quality of transmission signal are provided. The apparatus and the method suppress an image frequency component generated due to mismatch of IQ channels in order to transmit/receive a large amount of data without distortion in 4$^{th}$ generation wireless communication standard candidate technologies such as a Long Term Evolution (LTE) system and a mobile WiMax system. The apparatus includes a LOcal frequency (LO) buffer including an amplifier. The LO buffer controls the gain and the phase of the amplifier using a control bit for controlling resistor connection.

8 Claims, 5 Drawing Sheets

A

B

APPARATUS AND METHOD FOR COMPENSATING FOR IQ MISMATCH IN MOBILE COMMUNICATION SYSTEM

TECHNICAL FIELD

The present invention relates to an apparatus and a method for increasing Error Vector Magnitude (EVM) performance representing quality of transmission signal by suppressing an image frequency component generated due to mismatch of IQ channels in order to transmit/receive a large amount of data without distortion in $4^{th}$ generation wireless communication standard candidate technologies. More particularly, the present invention relates to an apparatus and a method for reducing an image frequency component at a Radio Frequency (RF) output terminal by compensating for gain and phase mismatches of an IQ signal using AM-AM and AM-PM characteristics generated when an LOcal Frequency (LO) buffer operates in a nonlinear region by controlling resistance of a control bit.

BACKGROUND ART

Mobile communication system uses a technique of converting a baseband signal or an Intermediate Frequency (IF) signal to an RF signal, or converting an RF signal to a baseband signal or an IF signal using an IQ mixer.

However, in an actual IQ mixer, carrier leakage and IQ imbalance occur. The carrier leakage occurs because not only product of an input signal and an IQ LOcal frequency (LO) signal transferred from a local oscillator is transferred to an output terminal of the IQ mixer, but also an IQ LO signal leaks to the output terminal of the IQ mixer. The IQ imbalance includes gain imbalance that occurs because the sizes of an in-phase signal and a quadrature signal transferred from the local oscillator to the IQ mixer are not the same, and phase imbalance that occurs because an in-phase signal and a quadrature signal do not have a phase difference of 90°. When the carrier leakage and the IQ imbalance occur, an undesired noise component exists in an output of the IQ mixer to deteriorate a Signal-to-Noise Ratio (SNR), so that a bit error rate of a mobile communication system increases and so link performance deteriorates.

A transmitter of the conventional mobile communication system compensates for gain imbalance and phase imbalance of an IQ channel by compensating for an imbalance component at a baseband modem in order to remove an image frequency component.

In a method for removing an image frequency component, since compensation of an imbalance component of an IQ channel is performed inside a baseband modem, when a frequency in a band equal to or higher than 2 GHz is used as a carrier frequency, imbalance of Integrated Circuit (IC) itself, more particularly, phase imbalance becomes inevitably serious, so that a burden which the baseband modem should process increases.

In addition, unlike the above description, a transmitter of the conventional mobile communication system may cancel an image frequency component using a compensation circuit inside an RFIC.

For this purpose, an output terminal of an IQ modulator monitors an image frequency component and compensates for IQ phase imbalance by controlling the phases of buffers existing on an I-path and a Q-path of an LO until the image frequency component generated by the IQ phase imbalance reduces below a predetermined level.

The above-described method may compensate for IQ phase imbalance inside an RFIC but cannot compensate for a gain imbalance component.

DISCLOSURE OF INVENTION

Solution to Problem

An aspect of the present invention is to address at least the above-mentioned problems and/or disadvantages and to provide at least the advantages described below. Accordingly, an aspect of the present invention is to provide an apparatus and a method for removing an image frequency component by compensating for IQ imbalance at a transmitter.

Another aspect of the present invention is to provide an apparatus and a method for improving link performance by allowing a transmitter to compensate for IQ imbalance at an RFIC chip.

Still another aspect of the present invention is to provide an apparatus and a method for improving link performance by controlling a gain and a phase of an amplifier according to variable resistance of an LO buffer at a transmitter.

In accordance with an aspect of the present invention, a transmitter for compensating for IQ imbalance in a mobile communication system is provided. The transmitter includes: a LOcal frequency (LO) buffer for removing an image frequency component of an output terminal by controlling gains of an I-channel amplifier and a Q-channel amplifier.

In accordance with another aspect of the present invention, a method for compensating for IQ imbalance in a mobile communication system is provided. The method includes: removing an image frequency component of an output terminal by controlling gains of an I-channel amplifier and a Q-channel amplifier.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF DRAWINGS

The above and other aspects, features and advantages of certain exemplary embodiments of the present invention will be more apparent from the following description taken in conjunction with the accompanying drawings in which.

Throughout the drawings, like reference numerals will be understood to refer to like parts, components and structures.

BEST MODE FOR CARRYING OUT THE INVENTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide an apparatus and a method for improving link performance by controlling the gain and the phase of an amplifier according to variable resistance of a LOcal frequency (LO) buffer in order to compensate for IQ imbalance and remove an image frequency component at an RFIC chip.

Figure 1:
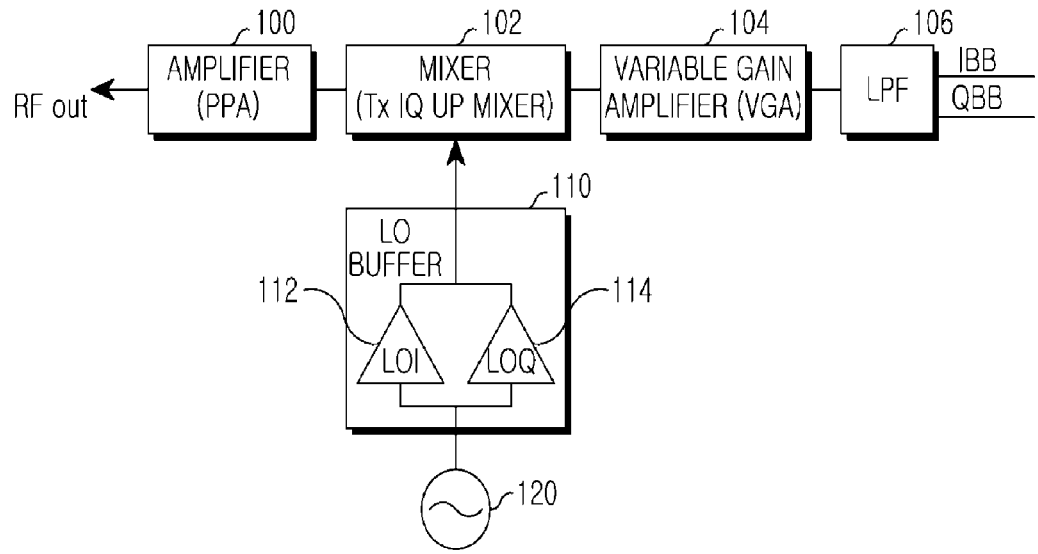
FIG. 1 is a block diagram illustrating a transmitter for suppressing an image signal by controlling a gain and a phase of an amplifier according to an exemplary embodiment of the present invention.

FIG. 1 is a block diagram illustrating a transmitter for suppressing an image signal by controlling a gain and a phase of an amplifier according to an exemplary embodiment of the present invention.

Referring to FIG. 1, the transmitter may include a Pre-Power Amplifier (PPA) 100, a mixer 102, a Variable Gain Amplifier (VGA) 104, a Low Pass Filter (LPF) 106, a LOcal frequency (LO) buffer 110, and a local frequency oscillator 120.

The VGA 104 controls a gain of a signal output from the LPF 106 using a gain control value for controlling an analog signal gain.

The local frequency oscillator 120 generates a transmission frequency signal in order to convert a baseband signal so that the baseband signal is transmittable. The local frequency oscillator 120 generates an IQ LO signal to be transferred to the mixer 102.

The LO buffer 110 includes an LOI amplifier 112 and an LOQ amplifier 114 and controls the gain and the phase of an IQ signal generated by the local frequency oscillator 120.

The LOI amplifier 112 or the LOQ amplifier 114 may include three amplification stages. The last amplification stage of the three amplification stages includes a variable resistor, three resistors, and three switches (not shown), and controls the gain and the phase of an IQ signal of a local frequency.

That is, the LO buffer 110 removes an image frequency component of an I-channel using the gain of the LOI amplifier 112 according to a control bit. In addition, the LO buffer 110 removes an image frequency component of a Q-channel using the gain of the LOQ amplifier 114 according to a control bit.

The operation of the LO buffer 110 is described in more detail with reference to FIGS. 2 to 6.

The mixer 102 receives output signals from the local frequency oscillator 120, that is, an in-phase signal and a quadrature signal controlled by the LO buffer 110, and a signal output from the VGA 104, and multiplies the input signals to output an uplink signal and transfer the uplink signal to the PPA 100.

The PPA 100 amplifies the power of each transmission signal received from the mixer 102.

Figure 2:
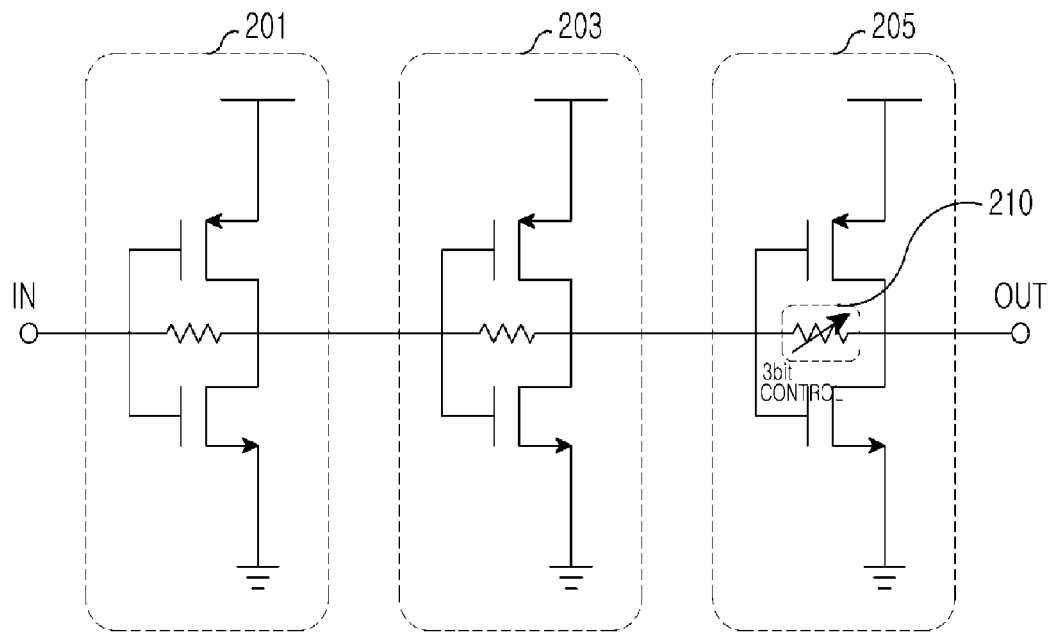
FIG. 2 is a circuit diagram illustrating an LO buffer according to an exemplary embodiment of the present invention.

FIG. 2 is a circuit diagram illustrating an LO buffer according to an exemplary embodiment of the present invention.

Before description of an LO buffer according to an exemplary embodiment of the present invention, an image component existing in an output signal of a transmitter is generated by mismatch of IQ baseband input signals, mismatch of IQ input signal of a local frequency oscillator applied from a Phase Locked Loop (PLL), and mismatch of an IQ modulator itself.

In the conventional amplifier of a transmitter, when an input signal of the amplifier becomes large, a harmonic frequency component is generated due to a non-linear characteristic of an active device inside the amplifier, and distortion is generated to the signal, so that the amplifier is configured to operate in a linear region. However, unlike the conventional amplifier, the exemplary embodiment of the present invention controls an amplifier gain of an LO buffer to suppress an image frequency component by allowing an amplifier used for the LO buffer to operate in a nonlinear region.

Referring to FIG. 2, the LO buffer includes an LOI amplifier and an LOQ amplifier. The construction of the LO buffer described below may include the LOI amplifier and the LOQ amplifier.

The amplifier of the LO buffer, that is, the LOI amplifier or the LOQ amplifier may include three amplification stages 201, 203, and 205.

The last amplification stage 205 of the three amplification stages 201, 203, and 205 includes a variable resistor 210 as illustrated in FIG. 2. The amplifier includes three resistors and three switches (not shown) to control the gain and the phase of an IQ signal of a local frequency.

A process for controlling the gain and the phase of an IQ signal is described below.

In the LO buffer, feedback resistance of the amplifier including the variable resistor 210 may be controlled using a control bit of the LO buffer.

Here, the control bit is a 3-bit control bit and denotes a resistor connection reference value for controlling the gain of the amplifier. A resistor connection state according to the control bit may be defined as in Table 1.

TABLE 1

| control bit | resistor connection |
|---|---|
| 000 | $1^{st}$, $2^{nd}$, $3^{rd}$ resistors; closes |
| 001 | $1^{st}$ resistor; open $2^{nd}$, $3^{rd}$ resistors; closes |
| 010 | $1^{st}$, $2^{nd}$ resistors; open $3^{rd}$ resistor; closes |
| 011 | $2^{nd}$ resistor; open $1^{st}$, $3^{rd}$ resistors; closes |
| 100 | $2^{nd}$, $3^{rd}$ resistors; open $1^{st}$ resistor; close |
| 101 | $3^{rd}$ resistor; open $1^{st}$, $2^{nd}$ resistors; closes |
| 110 | $1^{st}$, $3^{rd}$ resistors: open $2^{nd}$ resistor; close |
| 111 | $1^{st}$, $2^{nd}$, $3^{rd}$ resistors: open |

TABLE 2

| control bit | resistor connection |
|---|---|
| 000 | $1^{st}$, $2^{nd}$, $3^{rd}$ resistors; closes |
| 001 | $1^{st}$ resistor; open $2^{nd}$, $3^{rd}$ resistors; closes |
| 010 | $1^{st}$, $2^{nd}$ resistors; open $3^{rd}$ resistor; closes |
| 011 | $2^{nd}$ resistor; open $1^{st}$, $3^{rd}$ resistors; closes |
| 100 | $2^{nd}$, $3^{rd}$ resistors; open $1^{st}$ resistor; close |
| 101 | $3^{rd}$ resistor; open $1^{st}$, $2^{nd}$ resistors; closes |
| 110 | $1^{st}$, $3^{rd}$ resistors: open $2^{nd}$ resistor; close |
| 111 | $1^{st}$, $2^{nd}$, $3^{rd}$ resistors: open |

For example, when a control bit of the LO buffer is changed to '000', the amplifier 205 including the variable resistor 210 may control the gain of the amplifier to control an image frequency component by controlling the variable resistor 210, that is, by closing the three switches to change resistance. That is, the LO buffer reduces an image frequency component at an RF output terminal by controlling resistance corresponding to the kind (eight cases) of the above-described control bit and compensating for the gain imbalance and the phase imbalance of an IQ signal using AM-AM and AM-PM characteristics generated when the LO buffer operates in a nonlinear region.

Up to now, an apparatus for improving link performance by controlling the gain and the phase of an amplifier according to variable resistance of an LO buffer in order to compensate for IQ imbalance and remove an image frequency component has been described. Hereinafter, a method for compensating for IQ imbalance by controlling the gain and the phase of the amplifier according to variable resistance of the LO buffer, and removing an image frequency component using the above-described apparatus will be described.

Figure 3:
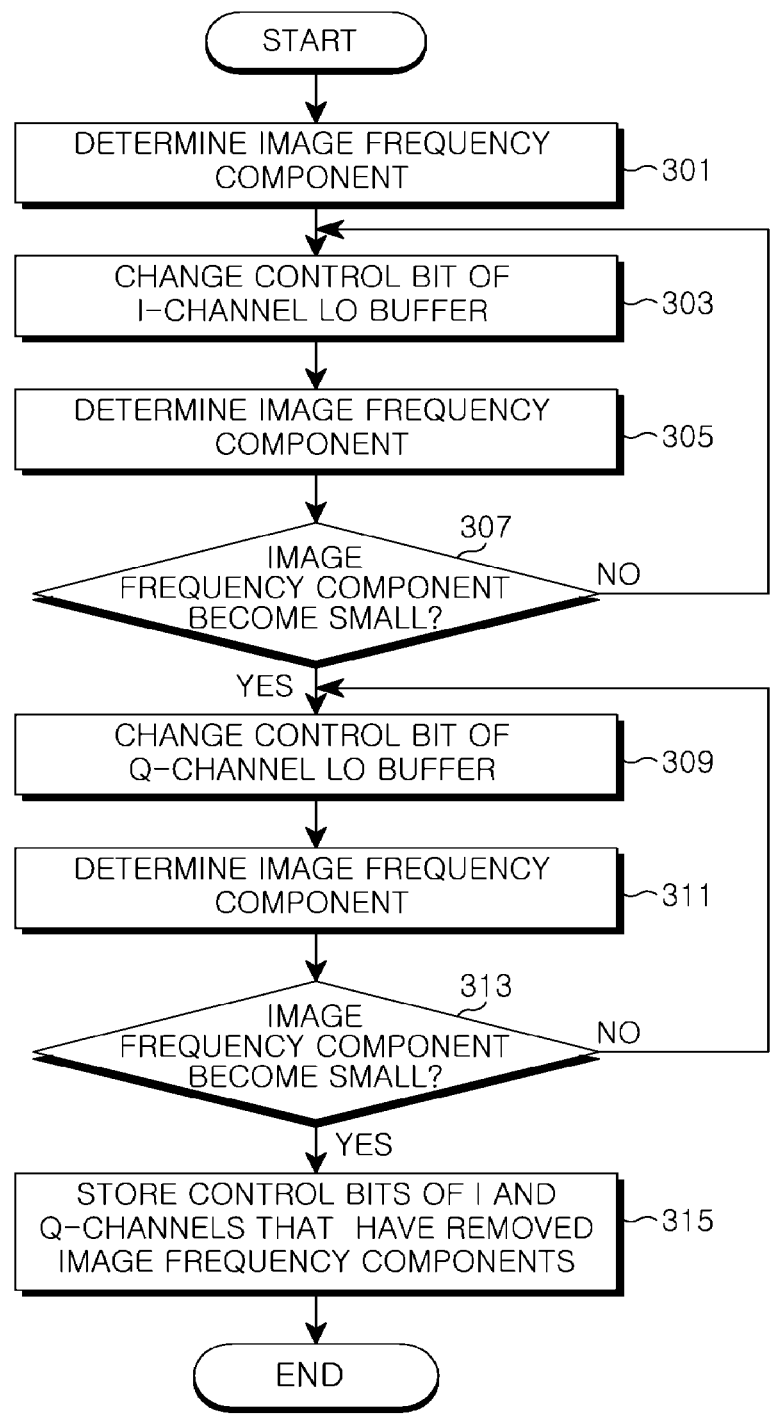
FIG. 3 is a flowchart illustrating a process for controlling IQ signal gain and phase of a local frequency oscillator at a transmitter according to an exemplary embodiment of the present invention.

FIG. 3 is a flowchart illustrating a process for controlling IQ signal gain and phase of a local frequency oscillator at a transmitter according to an exemplary embodiment of the present invention.

Referring to FIG. 3, the transmitter determines an image frequency component in step 301. Here, the determining of the image frequency component denotes determining an image component of a transmitter output terminal.

The transmitter controls the gain of an LOI amplifier by changing a control bit of an I-channel LO buffer in step 303, and determines an image frequency component in step 305.

The determining of the image frequency component in step 305 denotes determining whether an image frequency component of the I-channel has been removed by changing a control bit of the I-channel LO buffer.

The transmitter determines a result of step 305 in step 307.

When determining that the image frequency component has not been reduced as a result of step 305 in step 307, the transmitter performs a process of step 303 to change a control bit until the image frequency component reduces. That is, the transmitter determines a control bit for reducing the image frequency component by arbitrarily changing a 3-bit control bit for controlling an amplifier gain of the LO buffer as illustrated in Table 2 according to an exemplary embodiment of the present invention.

For example, when a control bit changes to '000', the transmitter closes three switches of the LO buffer to change variable resistance. When determining that a control bit is '111', the transmitter opens the three switches to change the variable resistance. Here, when the variable resistance increases, the gain of the amplifier increases. When the variable resistance reduces, the gain of the amplifier reduces.

When determining that the image frequency component has reduced as a result of step 305 in step 307, the transmitter changes a control bit of a Q-channel LO buffer to control the gain of an LOQ amplifier in step 309, and determines an image frequency component in step 311.

The process for determining the image frequency component in step 311 denotes a process for determining the image frequency component of the Q-channel has been removed by changing a control bit of the Q-channel LO buffer.

The transmitter determines a result of step 311 in step 313.

When determining that the image frequency component has not been reduced as a result of step 311 in step 313, the transmitter performs step 309 to change a control bit until the image frequency component reduces.

In contrast, when determining that the image frequency component has reduced as a result of step 311 in step 313, the transmitter controls a gain inside an RFIC chip by storing a control bit of the I-channel LO buffer that has reduced the image frequency component of the I-channel, and a control bit of the Q-channel LO buffer that has reduced the image frequency component of the Q-channel to omit an imbalance component compensation process of a baseband modem in step 315.

After that, the transmitter ends the present algorithm.

FIGS. 4A and 4B are graphs illustrating performance that controls the gain and the phase of an IQ signal by controlling variable resistance of an LO buffer at a transmitter according to an exemplary embodiment of the present invention.

Referring to FIGS. 4A and 4B, the transmitter may control the gain and the phase of an amplifier for all cases of 3 bits (the above-described eight cases) using a 3-bit control bit.

FIG. 4A is an AM-AM characteristic graph illustrating relation between an input signal size and an output signal size of an LO buffer corresponding to a 3-bit control bit.

FIG. 4B is an AM-PM characteristic graph illustrating relation between an input signal size and an output signal size of an LO buffer corresponding to a 3-bit control bit.

Figure 4:
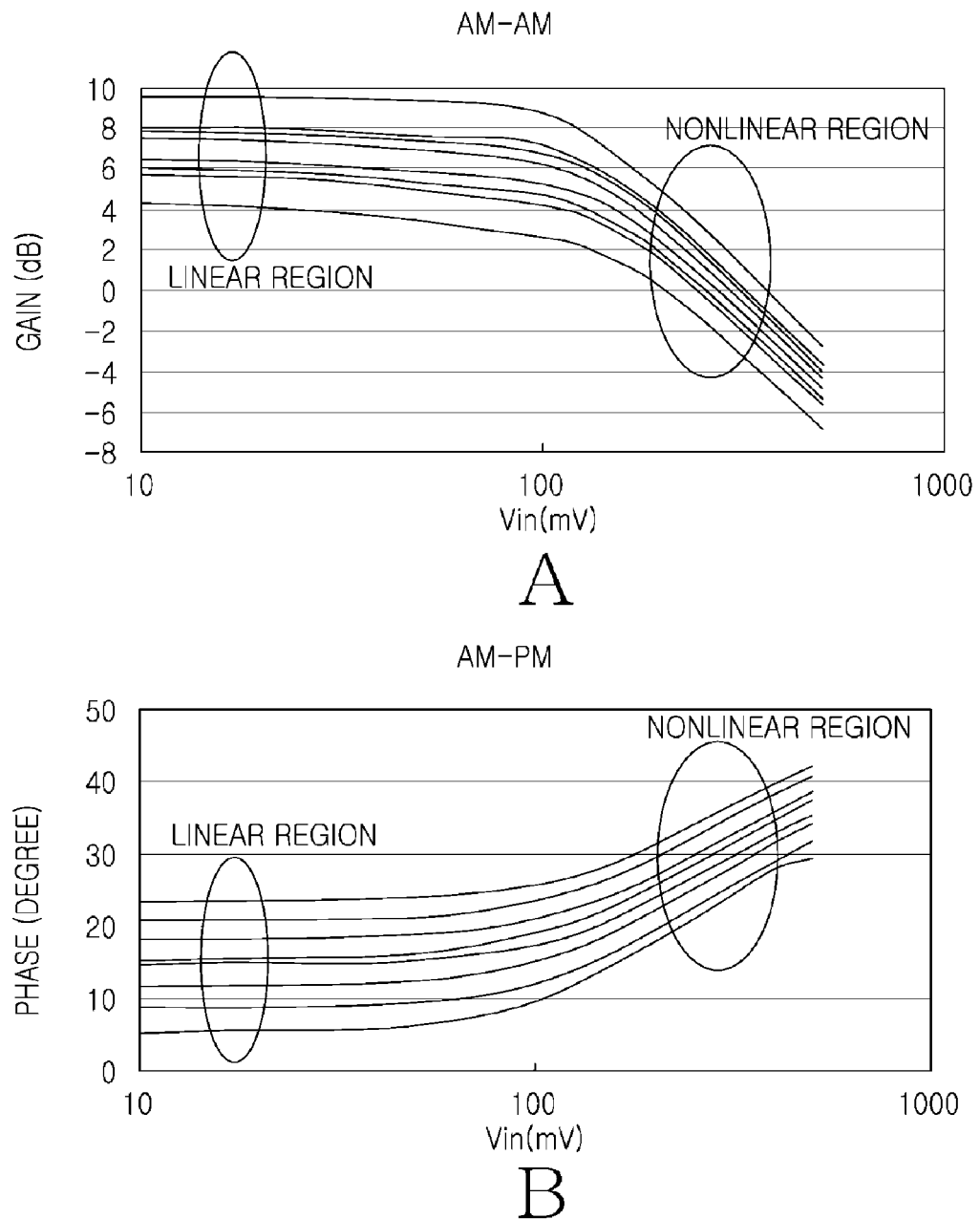
FIG. 4A is an AM-AM characteristic graph illustrating relation between an input signal size and an output signal size of an LO buffer corresponding to a 3-bit control bit.
FIG. 4B is an AM-PM characteristic graph illustrating relation between an input signal size and an output signal size of an LO buffer corresponding to a 3-bit control bit.

Referring to FIG. 4, a transmitter may control the gain and the phase of an IQ signal applied to an IQ modulator by controlling each resistance of an LO buffer. That is, an exemplary embodiment of the present invention reduces an image frequency component at an RF output terminal by compensate for IQ gain imbalance and phase imbalance using AM- AM and AM-PM characteristics generated when the LO buffer operates in a nonlinear region.

Figure 5:
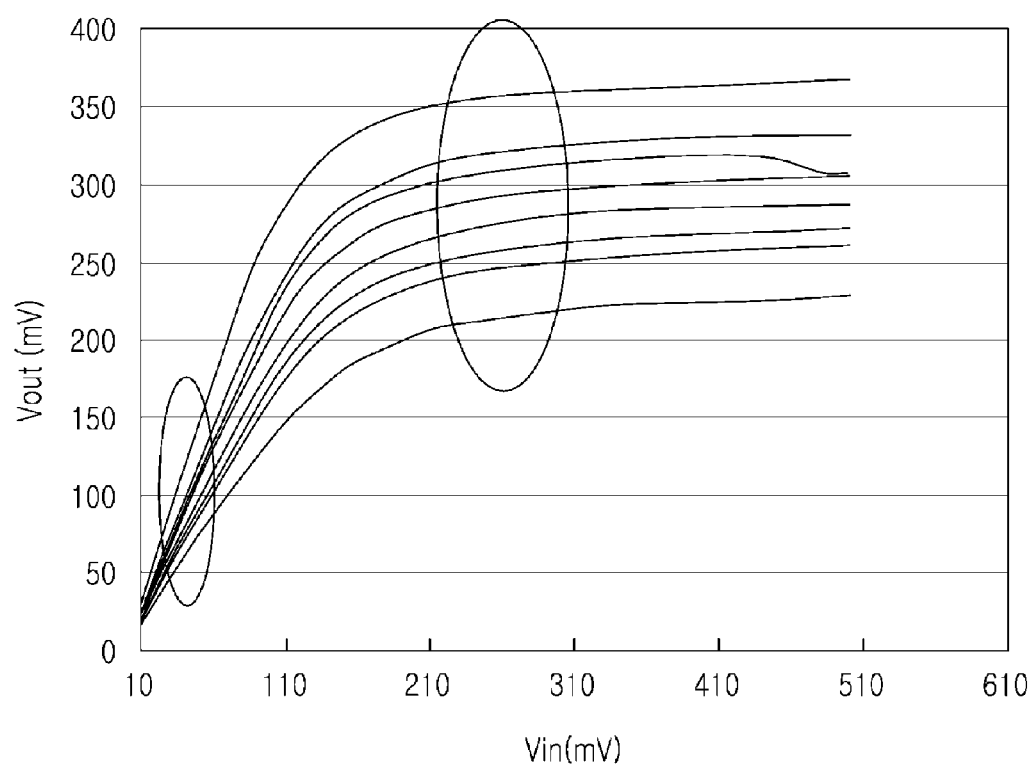
FIG. 5 is a graph illustrating an output voltage of an LO buffer generated when a transmitter according to an exemplary embodiment of the present invention operates in a nonlinear region.

FIG. 5 is a graph illustrating an output voltage of an LO buffer generated when a transmitter according to an exemplary embodiment of the present invention operates in a nonlinear region.

Referring to FIG. 5, a change range of a buffer output voltage when the LO buffer operates in the nonlinear region is smaller than a change range of the buffer output voltage when the LO buffer operates in a linear region.

Figure 6:
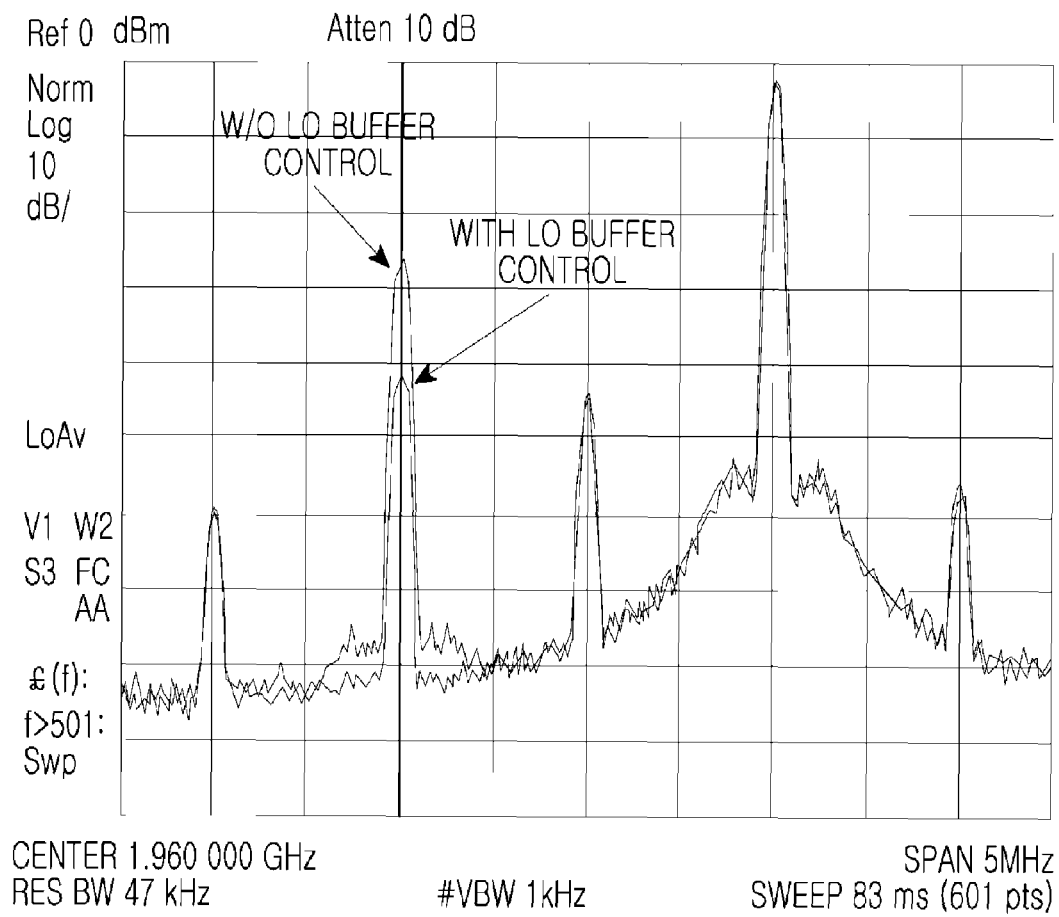
FIG. 6 is a graph illustrating output of a transmission signal measured at a transmitter according to an exemplary embodiment of the present invention.

FIG. 6 is a graph illustrating output of a transmission signal measured at a transmitter according to an exemplary embodiment of the present invention.

FIG. 6 illustrates values measured when an RFIC using a 65 nm Complementary Metal Oxide Semiconductor (CMOS) process has been designed in order to verify the present invention.

First, the transmitter has used 1960 MHz as a local signal frequency, and used a signal in a band of 1 MHz (a baseband input signal). When resistance of the LO buffer is not controlled, an image frequency component of 1959 MHz is generated due to a mismatch component, so that an Image Rejection Ratio (IRR) is 26 dB. In contrast, when the resistance of the LO buffer is controlled, a mismatch component is compensated for based on an operational principle of an exemplary embodiment of the present invention, so that an IRR of 42 dB where an image frequency component has reduced by 16 dB may be obtained. This enhances signal quality by improving an influence of Error Vector Magnitude (EVM) caused by an image frequency component by 16 dB.

Analysis of the above-description shows that an exemplary embodiment of the present invention may address problems of a size of a Metal Oxide Semiconductor Field Effect Transistor (MOSFET) device and a consumed current increase which are generated when the conventional LO buffer of a size in the range between about 200 mVp and about 400 mVp operates in a linear region by operating the LO buffer in the nonlinear region instead of the linear region.

In addition, a buffer output voltage during an operation in the nonlinear region may reduce a width of a change with respect to an input voltage compared to a buffer output voltage during an operation in the linear region. Accordingly, a width of gain imbalance becomes small compared to a width of gain imbalance during an operation in the linear region.

As described above, an exemplary embodiment of the present invention may address an SNR deterioration problem caused by IQ imbalance generated in the conventional mobile communication system by controlling resistance of an LO buffer to control the gain and the phase of an IQ signal applied to an IQ modulator and thus reducing an image signal at an RF output terminal.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

The invention claimed is:

1. A transmitter for compensating for IQ imbalance in a mobile communication system, the transmitter comprising a LOcal frequency (LO) buffer for removing an image frequency component of an output terminal by controlling gains of an I-channel amplifier and a Q-channel amplifier,
    wherein the LO buffer removes the image frequency component of an I-channel by controlling a corresponding control bit until the image frequency component is removed, and then controls the control bit to remove the image frequency component by controlling a control bit of the Q-channel amplifier to remove a corresponding image frequency component.

2. The transmitter of claim 1, wherein the LO buffer controls gains of the I-channel amplifier and the Q-channel amplifier to remove the image frequency component of the output terminal by controlling a control bit for controlling a gain of the amplifier to remove an image frequency component, and storing information of the control bit that has removed the image frequency component.

3. The transmitter of claim 1, wherein each of the I-channel amplifier and the Q-channel amplifier comprises three amplification stages, and a last amplification stage of the three amplification stages comprises a variable resistor to control a gain using the control bit.

4. The transmitter of claim 2, wherein the control bit comprises a value defining resistor connection in order to control a gain of the amplifier.

5. A method for compensating for IQ imbalance in a mobile communication system, the method comprising removing an image frequency component of an output terminal by controlling gains of an I-channel amplifier and a Q-channel amplifier,
    wherein the removing of the image frequency component comprises:
        determining the image frequency component by controlling a control bit of an I-channel amplifier;
        controlling the control bit until the image frequency component is removed; and
        when the image frequency component of an I-channel is removed, controlling a control bit of the Q-channel amplifier to remove a corresponding image frequency component.

6. The method of claim 5, wherein the removing of the image frequency component further comprises:
    removing the image frequency component by controlling a control bit for controlling the gain of the amplifier; and
    storing information of the control bit that has removed the image frequency component.

7. The method of claim 5, wherein each of the I-channel amplifier and the Q-channel amplifier comprises three amplification stages, and a last amplification stage of the three amplification stages comprises a variable resistor to control a gain using the control bit.

8. The method of claim 6, wherein the control bit comprises a value defining resistor connection in order to control a gain of the amplifier.

* * * * *